United States Patent
Wang et al.

(10) Patent No.: US 6,479,881 B2
(45) Date of Patent: Nov. 12, 2002

(54) LOW TEMPERATURE PROCESS FOR FORMING INTERMETAL GAP-FILLING INSULATING LAYERS IN SILICON WAFER INTEGRATED CIRCUITRY

(75) Inventors: Ying-Lang Wang, Tai-Chung (TW); Chun-Ching Tsan, Touliu (TW); Jowei Dun, Hsin-Chu (TW); Hung-Ju Chien, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/882,678

(22) Filed: Jun. 18, 2001

(65) Prior Publication Data

US 2001/0030351 A1 Oct. 18, 2001

Related U.S. Application Data

(62) Division of application No. 09/418,032, filed on Oct. 14, 1999, now Pat. No. 6,268,274.

(51) Int. Cl.[7] .............................................. H01L 29/00
(52) U.S. Cl. ......................... 257/508; 257/501; 257/750
(58) Field of Search ................................. 257/508, 758, 257/760, 750, 499, 501

(56) References Cited

U.S. PATENT DOCUMENTS

| | | | |
|---|---|---|---|
| 4,492,620 A | 1/1985 | Matsuo et al. | 204/192 R |
| 4,778,620 A | 10/1988 | Goto et al. | 252/299.63 |
| 4,962,063 A | 10/1990 | Maydan et al. | 437/228 |
| 5,494,854 A | 2/1996 | Jain | 437/195 |
| 5,679,606 A | 10/1997 | Wang et al. | 437/195 |
| 5,728,631 A | 3/1998 | Wang | 438/787 |
| 5,776,834 A | 7/1998 | Avanzino et al. | 438/692 |
| 5,814,564 A | 9/1998 | Yao et al. | 438/723 |
| 6,129,819 A | * 10/2000 | Shan et al. | 204/192.3 |
| 6,136,685 A | * 10/2000 | Narwankar et al. | 438/624 |
| 6,251,799 B1 | * 6/2001 | Lai et al. | 438/760 |
| 6,391,795 B1 | * 5/2002 | Catabay et al. | 438/763 |

OTHER PUBLICATIONS

"Improved Sub–micron Inter–metal Dielectric Gap–filling Using TEOS/Ozone APCVD", by E.J. Korczyski et al., published in the Micro–electronics, Jan. 1992, pp. 22–27.

* cited by examiner

Primary Examiner—Richard Elms
Assistant Examiner—Brad Smith
(74) Attorney, Agent, or Firm—George O. Saile; Stephen B. Ackerman

(57) ABSTRACT

A semiconductor wafer having a double inter-metal dielectric layer formed in the gaps of and on closely. spaced metal interconnection circuitry. The double dielectric layer is formed by an in situ low temperature two step deposition HDP-CVD process separated by a cool-down period. The low temperature process mitigates metal line defects such as distortion or warping caused by heat generated during the process of filling gaps having aspect ratios greater than 2. The double dielectric layer is composed of Group IV materials, silicon being the preferred material. These double layers may be individually doped. Titanium nitride layers, present as by-products of seeding and anti-reflective coatings serve to reduce electro-migration of the metal circuitry.

2 Claims, 2 Drawing Sheets

LOW TEMPERATURE PROCESS FOR FORMING INTERMETAL GAP-FILLING INSULATING LAYERS IN SILICON WAFER INTEGRATED CIRCUITRY

This is a division of patent application Ser. No. 09/418,032, filing date Oct. 14, 1999, now issued as U.S. Pat. No. 6,268,274, A Low Temperature Process For Forming Inter metal Gap-Filling Insulating Layers In Silicon Wafer Integrated Circuitry, assigned to the same assignee as the present invention.

BACKGROUND OF THE INVENTION

1. Field of the Invention

This invention relates to a structure and process for fabricating an inter metal dielectric layer for integrated circuits interconnecting active and passive elements. More particularly, this invention relates to a structure and process for an inter metal dielectric layer formed using electron cyclotron resonance techniques employing high density plasma (HDP) and chemical vapor deposition (CVD) processes. A unique HDP-CVD two step deposition process is described that allows cooling between the steps thereby providing metal circuitry possessing no warping or distortion.

2. Description of the Prior Art

Integrated circuitry (IC) found in semiconductor chips are used in a variety of applications such as computers, televisions, and cars to name just a few. IC can combine millions of transistors onto a single crystal silicon chip to perform complex data and store data. There has been a strong desire and significant advancement in shrinking the dimensions of IC thereby providing a greater number of functions in an ever smaller volume. An excellent example is the hand held calculator which initially could only perform simple mathematical functions but now can perform the most sophisticated mathematical modeling or statistical analysis at a fraction of the cost of the older models. Cost and size reduction are major factors driving this technology and no end seems in sight. Historically, such process improvements have resulted in roughly a 13% annual decrease in the minimum feature widths achievable for transistors mid interconnections.

With miniaturization comes an increased complexity of interconnect wiring used to transport data across a chip, Complex wiring patterns that can include multiple layers can be found in IC. The problem of electronic isolation of the individual circuits becomes significant since designs must deal with intralayer as well as interlayer effects. Electronic isolation has been accomplished by providing insulating or dielectric material between the circuit neighbors. Obviously as the dimensions shrink there is greater challenge to maintain electronic isolation.

In the conventional formation of conductive lines in an integrated circuit, a metal layer is deposited and patterned by conventional lithography and etching techniques to form metal lines/patterns, thus creating an uneven surface on the semiconductor material. In addition to finding suitable dielectric materials that will provide adequate electronic isolation, miniaturization has also created the problem of providing techniques that will adequately apply the dielectric, insulating material. The problem faced in this regard is that although the distances between circuitry lines is decreasing, the height of the circuitry lines formed by photolithographic means is not decreasing. This creates a situation where the dielectric material must be applied between tall, closely spaced features. Features with this topography are said to have high aspect ratios (height/width) and understandably it becomes very difficult to fill between those features.

It is often desirable for the insulating layer to be so formed that the upper surface of the insulating layer is planar over an extended region, irrespective of whether individual portions of the upper surface overlie metal lines or contacts or the spaces between such lines/contacts. The formation of such an insulating layer having a planar upper surface is referred to as planarization Those skilled in the art know this insulating layer by many terms, such as, dielectric layer, gap filling layer, and passivation layer. All these terms are used interchangeably in this document and therefore should be construed to have the same meaning. It is especially important to have a planarized surface when additional circuitry is to be stacked in a multilayer design.

Although various processes have been available for forming insulating (gap filling) layers, chemical vapor deposition (CVD) was preferred since it seemed to meet the stringent requirements of filling high aspect channels between individual circuit lines. However, the temperatures that were required to perform this technique can be very high and lead to warping, distortion or other defects to metal line circuitry. In order to provide for etching or sputtering the technique of plasma generation was used to enhance CVD. Plasma deposition processes are of interest in this regard, because they may be able to form insulating layers of silicon dioxide or silicon nitride at relatively lower temperatures. In particular, high density plasma (HDP) processes, such as electron cyclotron resonance (ECR) processes and induced coupling plasma (ICP) processes have been found to produce high-quality silicon dioxide and silicon nitride layers. High density plasma (HDP) when combined with CVD provides for an HDP-CVD process such as plasma enhanced chemical vapor deposition (PECVD) that allows both simultaneous deposition and sputtering and is performed in an electron cyclotron resonance (ECR) apparatus. With this tool it is possible to vary the ratio of deposition to sputter etching. And although this technique can indeed be used at a lower temperature than conventional CVD it still causes unacceptably high temperatures at the early stages of gap filling when low deposition/sputter ratios (typically less than 4) are necessary to fill the high aspect ratio channels. This is especially noted for metallic lines composed of aluminum and its alloys such as aluminum copper. Temperatures as high as 400° C. have been observed and at these temperatures significant distortion of the metal features and circuitry can be observed. Aluminum contacts are intolerant of processing temperatures greater than about 350–400 C. because at such temperatures "hillocks" tend to form in aluminum or aluminum alloy features.

The conventional HDP CVD process described hereinabove has a major drawback in that the high density plasma (HDP) deposition of the ECR oxide insulating layer often damages the underlying circuit elements, especially metal lines. High density plasma (HDP) sources employ magnetic fields and microwave power to create chemically active plasmas, preferably at very low gas pressures. It is difficult to control the energy transferred to the reactant ions in the plasma deposition. The high density plasma (HDP) chemical vapor deposition (CVD) process (e.g., ECR) is an in situ sputtering and deposition process using an argon flow, high microwave power and RF power. The deposition and sputtering steps are performed sequentially and are repeated until the proper coverage is obtained. When the metal lines on the wafers are subjected to in situ sputtering this creates a damaging "antenna effect". The higher microwave power generates higher ion energy which increases the damage to the metal lines. The high power during the ECR oxidation process creates transconductance (i.e., gin) degradation due to the Fowler-Nordheim (F-N) tunneling stress. The defect that is readily observable is can be described as a hillock that protrudes above the surface of insulative layer and creating concurrently a void in the wall between the opposite side of the metal line and its adjacent insulative layer.

Therefore, there is still a need to create a structure and process whereby the damage to semiconductor devices, e.g., metal lines, from high density plasma (e.g. HDP and PCR) deposition of insulating layer is-significantly reduced or eliminated.

Jain in U.S. Pat. No. 5,494,854, describes a gap-fill dielectric layer useful conductor lines that have low and high aspect channels separating the lines. In this invention HDP is used to assist in forming a dielectric layer that is specifically planarized in areas that cover high aspect conductor lines but necessarily between low aspect conductor lines. Furthermore, Jain does not teach the benefit of a pause time during the HDP process.

Wang et al. in U.S. Pat. No. 5,679,606, describe a process for forming a planar dielectric layer over metal lines using an in situ multi-step ECR deposition process. The invention describes forming a series of coatings that are alternating "gap filling" and "protective" dielectric which coat the metal lines and the substrate. The initial "protective" coating is formed using the ECR process and employs no argon flow during this step. The "gap filling" coating is now prepared also using the ECR process but now in this case with an argon gas flow. The "gap filling" process simultaneously etches and deposits. However, it etches mainly on the topmost surface of the metal lines, in doing so, it reduces the aspect ratio of the channels thereby ultimately facilitating in planarization. Although a multi-step process is described by Wang et al., no mention is made of having a pause time between the steps, nor is any concern expressed about cooling the wafer during such a time period.

Wang in U.S. Pat. No. 5,728,631, describes a method of forming a low capacitance dielectric layer with the use of ECR. The layer is composed of silicon dioxide but is not uniform, since it is the expressed object of the invention to have closed voids of air between the metallic circuitry lines. Although Wang notes that changes to the etch-to-deposition rate must be altered during the process in order to obtain closed voids, no mention is made of having a pause time allowing cooling to occur as required by the present invention.

Avanzino et al. in U.S. Pat. No. 5,776,834 disclose a method of forming a planarized dielectric layer covering metal layers, said dielectric layer contains voids within the high aspect ratio channels (e.g. close metal line neighbors). The process comprises first coating a nonconformal source with a poor step function in order to generate the void. Then the nonconformal material is etched either simultaneously or sequentially along with deposition to fill the remaining gaps with void free insulating material. However, Avanzino et al. do not disclose a pause time between the two stages of the process and further make no mention of a cooling process during this time period.

Yao et al. in U.S. Pat. No. 5,814,564, teach a planarization method for a spin-on-glass layer over a dielectric layer that is applied by use of the HDP-CVD process. The planarization method involves a six step etchback process of the SOG layer to provide a planar upper surface. No mention is made of a pause time during the formation of the dielectric layer nor to any concern to provide cooling during the deposition/etching process.

Matsuo et al, U.S. Pat. No. 4,962,620, Goto, U.S. Pat. No. 4,778,620, and Maydan, U.S. Pat. No. 4,962,063 show methods and equipment for ECR deposition of dielectric layers. The article "Improved Sub-micron Inter-metal Dielectric Gap-filling Using TEOS/OZONE APCVD" by E. J. Korczyski et al, published in the Microelectronics, January 1992 pp. 22–27 provides a comparison of ECR and TEOS/O3 planarization methods.

Although considerable progress has been made in finding methods to reduce the metal line spacing on semiconductor wafers such as silicon single crystals, a problem still exists that manufacturing processes for the formation of the insulating layer can cause failures due to excessive heating of the metal lines. The most common failure is metal line distortion that manifests itself as reliability problems. This specific distortion problem is observed with the formation of unwanted "hillocks" that bulge out from the top of the metal line and are exposed on the surface of the insulator (dielectric) layer. This defect is especially noted in CVD processes but still problematic in one-step HDP-CVD processes where temperatures can still rise above 400° C. during the deposition process.

SUMMARY OF THE INVENTION

It is an object of the present invention to provide a method of forming a void-free inter metal dielectric/insulative layer.

It is another object of the present invention to provide a method of forming an inter-metal dielectric layer that will reduce the damage (specifically metal distortion) to conductive lines caused by HDP-CVD of silicon oxide insulating layers.

It is still another object of the present invention to utilize an in situ simultaneous deposition and sputtering (etching) HDP-CVD process to generate insulation layers for metal lines on semiconductor wafers.

It is yet another object of the present invention to provide a good oxide film protection to the metal lines without any metal line exposure to PECVD nitride film by using lower HDP CVD temperature.

It is yet another object of the invention to provide a gap filling, insulation layer that can readily be planarized to allow additional integrated circuitry be formed in layers thereon.

It is another object of the present invention to provide wafer boards for use as 0.35 micron logic boards and 0.25 micron DRAM.

Still another object of the present invention is to improve the throughput of the HDP CVD process for insulating metallurgical lines and thereby provide a low cost process.

In accordance with the above objectives, this invention provides an in situ low temperature two step process for forming an inter-metal dielectric layer of an integrated circuit structure reducing damage caused by excessive heat generated during electron cyclotron resonance deposition of insulating layers.

The inventive process relates to manufacturing insulating inter-layers between closely spaced metallurgy lines on a semiconductor substrate, such as silicon, having line spacing on the order of 0.25 micron or less. During the course of designing these articles it was observed that a defect known as a "hillock" would occasionally form. This was unexpected because the prior art had taught that manufacturing these insulating layers using techniques like HDP-CVD should be capable of manufacturing the insulative layer at low temperatures thereby avoiding high temperatures that could cause metal line distortion. However, for closely spaced lines, on the order of 0.25 micron or less, the process requires low deposition/etching ratio to fill the narrow channels and essentially simultaneous etching and deposition. This regime causes high temperatures to be generated. It was determined that-neither titanium nitride protective (seed) nor passivation (insulative) layer thickness would alleviate the defect. Furthermore, RF power did not seem to be an important factor in defect production. It was unexpectedly discovered that by increasing inert gas backside pressure and having a cooling period during the deposition process essentially eliminated the defect from forming. Therefore, the inventive process comprises insulating these lines by a two step HDP-CVD process wherein each step simultaneously deposits and etches a dielectric material such as silicon dioxide. The first step is performed with a low deposition-to-sputtering ratio (D/S) of 2 to 4 and Helium backpressure of 8 inner and 10 outer Torr. Subsequently there is a period of time where no deposition or etching is allowed and the wafer is subjected to cooling by applying a stream of inert gas to the backside of the wafer. After this treatment the deposition/sputtering is resumed with a D/S of 4 to 6 and a Helium backpressure of 6 inner and 10 outer Torr. In this manner the temperature of the metallurgy lines is maintained below a point that would cause distortion of the lines, specifically no "hillocks" are formed.

DETAILED DESCRIPTION OF THE PREFERRED EMBODIMENTS

Figure 1:
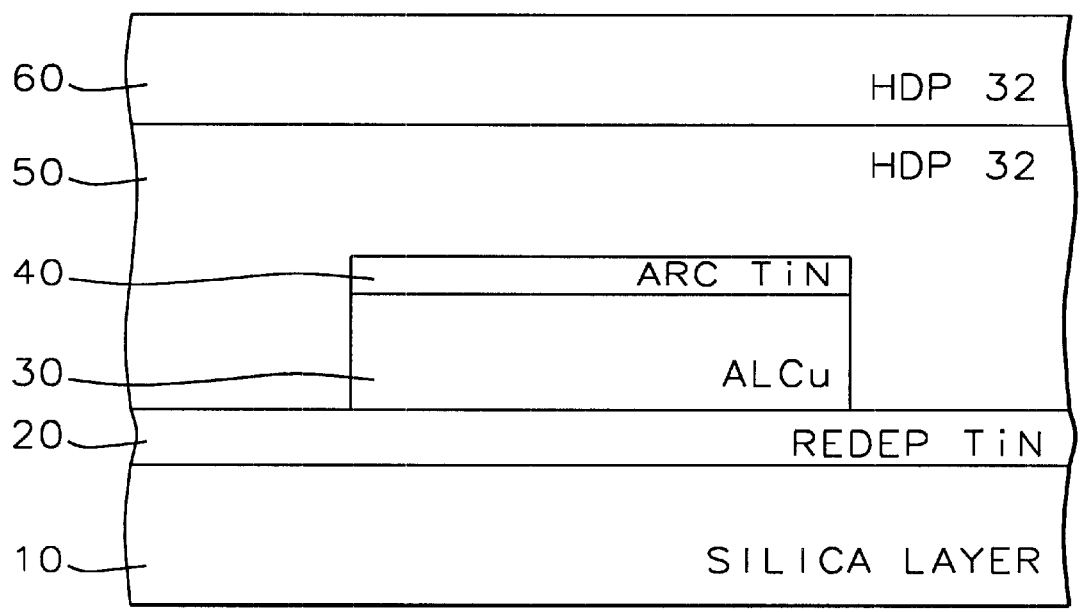
FIG. 1 is a schematic cross sectional view of the manufactured semiconductor wafer as disclosed in the present invention.

In the present invention, the dielectric layer, also referred to as an insulative, gap filling or passivation layer, is preferably formed of undoped silicon dioxide glass (USG). Insulating layers composed of this type of material can be applied to semiconductor wafer surfaces using electron cyclotron resonance (EOR) plasma deposition as described in U.S. Pat. No. 4,962,063, Maydan et al. and is hereby incorporated by reference. In one preferred embodiment the process begins with deposition of a uniform seed layer (20) of titanium nitride (TiN) on the lateral surfaces of the silicon substrate (10). This layer is approximately 100 to 1000 A in thickness. The preferred thickness of the titanium nitride layer is in the range between about 300 to 800 A and more preferably about 500 A. This step is optional and other embodiments of the present invention do not require this treatment.

Closely spaced metallurgy lines (30) are formed on a semiconductor substrate (e.g., single crystal silicon) or the optional TiN layer, typically by photolithographic means. In this manner line width and line spacing of <0.25 micron are achievable and further used in the present invention. The height of the lines can be between 0.3 microns and 1.2 microns. The preferred thickness of the metal lines is about 0.8 micron, therefore the aspect ratio of these metallurgy lines will typically be >2. The metallurgy lines can be composed of any metallic substance that can transmit electrical current, examples include aluminum and its alloys, copper and its alloys, and nickel and its alloys. Preferred metallurgy include aluminum and its alloys. The most preferred metal composition is aluminum:copper (95:5).

Optionally, a top coat seed layer (40) of titanium nitride (TiN) is deposited on the uppermost surface of the metal substance prior to circuitization. This layer is approximately 100 to 500 A in thickness and is known in the industry as an "antireflective coating" (ARC). The purpose of the ARC is to reduce the reflective light from the stepper during the photolithographic process. Furthermore, the ARC can also reduce the electromigration of metal lines.

The preferred thickness of the titanium nitride layer (40) is in the range between about 150 to 400 A and more preferably about 250 A.

Subsequently, the seed layer (20) and the ARC TiN (40) covered metallurgy lines (30) are encapsulated with stoichiometric, high quality silicon dioxide passivation layers (50 and 60). The passivation layers are formed by an HDP-CVD technique utilizing two separate in situ, simultaneous deposition and sputtering steps separated by a cooldown period. The specific conditions for the deposition and sputtering steps provide void-free gap-filling between the metal structures. The first deposition/sputtering step is characterized by a low D/S ratio of about 3.2 while the second D/S ratio is characterized by a high value of about 6. The D/S ratio is defined as:

$$D/S=\{(\text{net deposition rate})+(\text{blanket sputtering rate})\}/(\text{blanket sputtering rate}).$$

A helium backpressure of 6–8 Torr (inner) and 10–12 Torr (outer) is used during this process and the RF power bias is about 3000 to about 4000 W. Preferred wattage is 3500 W. The first deposition step takes approximately 70–90 seconds.

The passivation layers or insulation layers (50 and 60) can be composed of a dielectric material such as a Group IV material oxide, nitride or combination thereof. Specifically, silicon is the preferred Group IV material. These materials can also be doped with low levels of boron materials to create a positive doped insulation or phosphorous materials to generate a negative doped insulation. The oxide or nitride insulation are formed in situ and it is desirable that they do not form solid masses until they precipitate on the surface of the metal lines or newly deposited passivation layer. In this manner smooth coatings are generated. As mentioned supra, this process is known as deposition and is performed using an ECR apparatus with specific requirements for argon flow and RF power.

Occurring simultaneously with deposition is etching or sputtering of the newly deposited passivation layer. The etch rate is a function of surface angle as well as the argon flow and RF power.

The first passivation layer (50) is formed over the optional protective layer (40). The HDP-CVD process is set to so that the passivation layer fills in between the lines, but does not etch through the protective layer (40). The passivation layer (50) does not expose the metallurgy lines. The HDP-CVD parameters are set such that the passivation layer (50) can fill between closely spaced metallurgy lines without forming voids.

In this manner of deposition/sputtering the ratio is selected between a value of about 2 to about 4 and the passivation layer (50) is formed in the range between about 5000 to 10,000 A., more preferably about 7500 A, and most preferably 5000 A. During this time the wafer and the metal lines are being undesirably heated as a by product of the deposition/sputtering process. The heating raises the temperature of the wafer and the metal lines essentially monotonically with time so that the thicker the layer deposited the higher the temperature of the metal lines (30). Above a critical temperature the metal lines will become distorted as the metal lines (30) essentially flow through the protective layer (40) and cover a portion of the newly formed passivation layer (50). Therefore, the maximal thickness of the passivation layer (50) in this step is dictated by the temperature of the metal lines (30). As mentioned supra, typically the thickness of the passivation layer (50) at this point in the process will be approximately 5000 to 6000 A.

Figure 2:
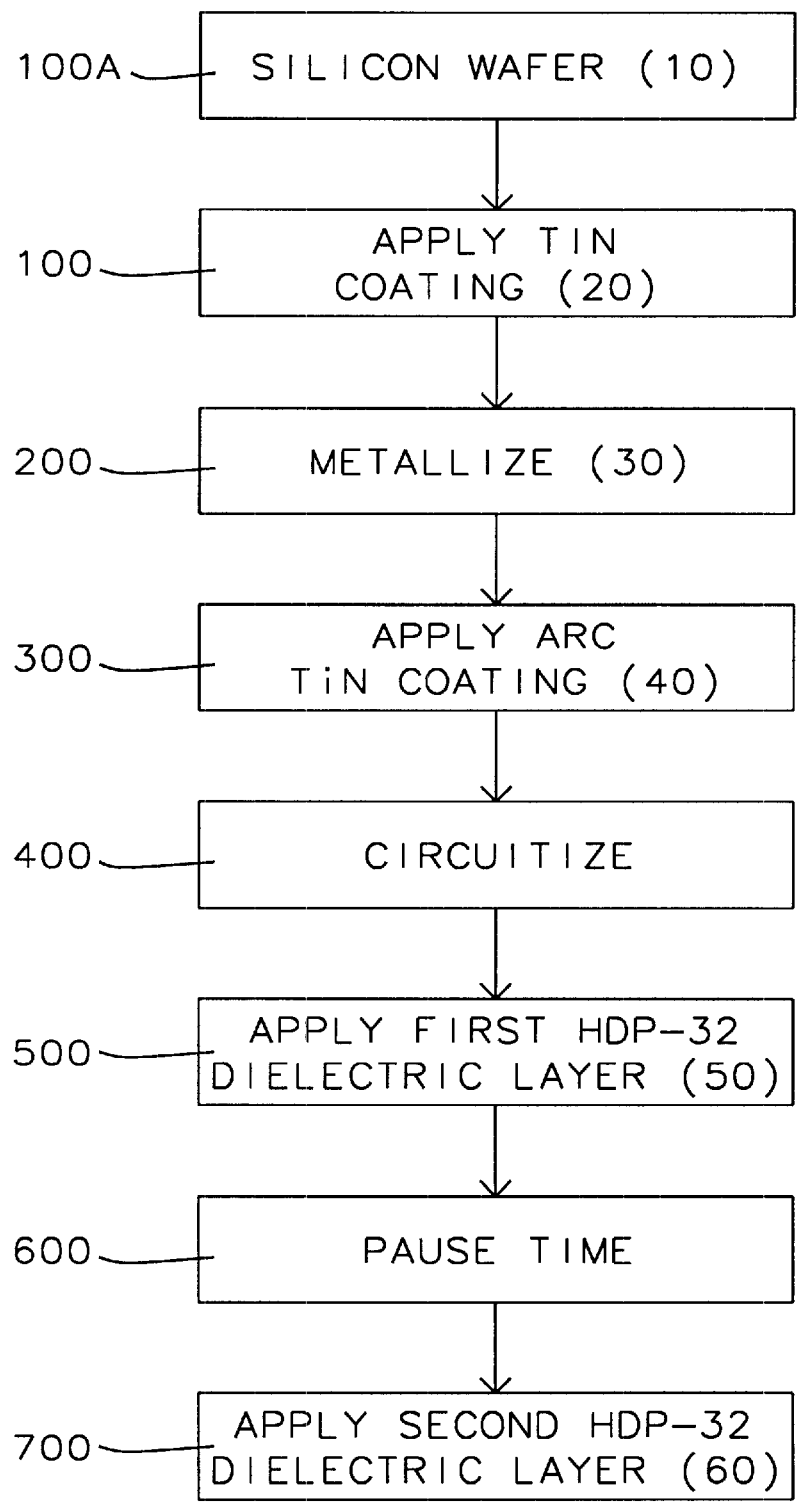
FIG. 2 is a flow chart describing the critical manufacturing steps to produce the wafer schematically shown in FIG. 1.

The overall process flow for the invention is depicted in FIG. 2 as a flow diagram.

A key inventive feature of the process in the present invention is the cooldown period between the first deposition/sputtering step described above and a second deposition/sputtering step described hereinbelow. The cooldown process employs argon or helium gas applied to the wafer backside for a period of about 10 seconds. By performing the process in this manner the temperature of the metal lines never exceeds about 350 C., well below the melting point of the metal lines. The protective layer so formed does not attack the metallurgy lines and shields the metallurgy lines from attack from the subsequent ECR depositions of "gap filling layers".

An alternative embodiment of the present invention replaces the cooldown period with a "vacuum break", however this step requires approximately 120 seconds and therefore is longer and less desirable than the cooldown period of approximately 10 seconds.

The cooling period is required in order to continue the process of increasing the thickness of the passivation layer while still maintaining temperatures of the metal lines that will not cause distortion defects. It is highly desirable to cool the wafer and the metal lines using an in situ process so that the wafer need not be disturbed. This is provided by applying an inert gas under high flow to impinge the backside of the wafer. Inert gas such as argon or helium are typically utilized for this purpose but it is within the scope of the invention that other gases such as could be used. The cooling process is selected to cool the wafer to such a point the remaining deposition/sputtering process will not cause damage to the metal lines. Typically this yields cooling times on the order of about ten seconds. Longer times are allowable but no obvious benefit is derived.

An alternative embodiment of the present invention replaces the cooldown period with a "vacuum break", however this step requires approximately 120 seconds and therefore is longer and less desirable than the cooldown period of approximately 10 seconds.

Following the cool down phase, the process of deposition/sputtering is resumed. Since the first deposition of the passivation layer was not conformal due to the low deposition/sputter value, the covered metal lines now have an aspect ratio of approximately 1. For the second phase of deposition the deposition/sputtering ratio can now be increased from about 5 to about 7. Under these conditions it is possible to fill in the channels between the lines and further deposit material on the upper surface so that an additional 3000 to about 7000 A is deposited on the wafer. The preferred thickness for the second deposition is 5000 A. The total thickness of the two combined passivation layers covering the wafer is approximately 8000 to about 13000 A whether or not there is a metal line beneath the surface, therefore at this point in the process the passivation layer is essentially planar. The preferred thickness for the two combined stages is 10,000 A.

The process is performed using helium backside pressure of 8 Torr (inner) and 10 Torr (outer) and a bias RF wattage of between 2500 to about 3500 W. Preferred wattage is approximately 2800 W. This phase of the process takes approximately 40 to 50 seconds. It is within the scope of this invention that the dielectric material deposited be the same or different than that used in the first deposition process, optional materials are described supra in the section discussing the first deposition process.

Optionally a capping layer can be applied to the top surface of the passivation layer should that be desired. Following the optional capping layer additional metallurgy lines can be formed on the uppermost surface.

WORKING EXAMPLES

Example 1

Process for Forming the First Insulative Layer (50); Step 500 in the Flow Diagram.

The first dielectric layer (50) prior to the cooling period is formed of silicon dioxide and is formed using electron cyclotron resonance (ECR) plasma deposition as described in U.S. Pat. No. 4,962,063, Maydan et al. Oxygen should be fed into the plasma formation chamber at a rate of from about 80 standard cubic centimeters per minute (sccm) to about 150 sccm; and silane into the deposition chamber, at a rate of from about 30 sccm to about 80 sccm; and argon at a rate between about 80 to 140 sccm and more preferably about 110 sccm; while maintaining the temperature in the deposition chamber at from about 25° C. to about 400° C.; and a pressure ranging from about 2 to about 15 Millitorr. A plasma power level of from about 1000 to about 2000 Watts should be used.

Example 2

Good quality HDP may be deposited, for example, in an Applied Materials deposition chamber using the following procedure: a wafer (containing the substrate) is mounted in the chamber such that backside helium cooling may be used to control temperature; the chamber is then evacuated to 240 Millitorr, and a mixture of 120 sccm oxygen and 110 sccm argon are supplied to the chamber; 1300 W of source RF power are used to create a plasma (which also heats the wafer), and the temperature of the wafer is maintained at 310 to 320 C. by backside cooling; after 10 to 15 seconds of operation, 150 sccm silane is also introduced into the chamber, causing a silane oxide to deposit on the wafer; after 10 to 15 seconds of operation, 2800 W of bias power is applied to initiate dc-bias sputtering; at this point, net deposition rate drops to 1500 to about 2500 A./sec, with roughly a 4:1 deposition to sputter ratio. At this rate, an excellent quality oxide may be deposited.

It should be noted that the invention as described hereinabove depicts a metallurgical circuitry of lines (30) that are affixed to the silicon substrate (10), however, the invention is not limited to this design, in fact, this invention can be employed for metallurgical circuitry on any layer within a multi-layered integrated circuit design. Furthermore, the invention can be practiced on multiple layers within a multilayered integrated circuit design.

The in situ two-step deposition process (Steps 500, 600, 700 of FIG. 2) of the invention forms dielectric oxide layers between closely spaced lines without damaging the metallurgy lines. The process is inexpensive, simple to implement and increases device yields.

While the invention has been particularly shown and described with reference to the preferred embodiments thereof, it will be understood by those skilled in the art that various changes in form and details may be made without departing from the spirit and the scope of the invention.

What we claim is:

1. A semiconductor wafer having void free dielectric filled high aspect ratio metal circuitry comprising:

a) a silicon wafer having an upper lateral surface;

b) a first titanium nitride layer covering the upper lateral surface of the silicon wafer; said first titanium nitride layer having a thickness of about 300 to 800 Angstroms;

c) individual metal circuitry having spacing disposed on said first titanium layer; said metal circuitry having a thickness between 0.3 to 1.2 microns; said metal circuitry spacing having aspect ratios greater than 2, said metal circuitry being selected from a group consisting of aluminum, aluminum alloy, copper, copper, copper alloy, nickel and nickel alloys;

d) a second titanium nitride later covering the upper surface of the metal circuitry said second titanium layer having a thickness of about 100 to 500 Angstroms;

e) a void free first dielectric layer covering said individual metal circuitry lines and filling said spacing, said first dielectric layer having a thickness of about 5000 to 10000 Angstroms; said first dielectric layer conformal topography having an aspect ration of about 1.

f) a void free second dielectric layer covering said first dielectric, said second dielectric layer having a thickness of about 3000 to 7000 Angstroms; said second dielectric layer having a planar upper surface.

2. The semiconductor wafer recited in claim 1 wherein said first and second dielectric layers are independently comprised of undoped or doped silicon.

* * * * *